(12) United States Patent
Fujiwara et al.

(10) Patent No.: US 6,917,048 B2
(45) Date of Patent: Jul. 12, 2005

(54) METHODS AND DEVICES FOR CONTROLLING BLUR RESULTING FROM THE SPACE-CHARGE EFFECT AND GEOMETRICAL ABERRATION IN A CHARGED-PARTICLE-BEAM MICROLITHOGRAPHY APPARATUS

(75) Inventors: Tomoharu Fujiwara, Ageo (JP); Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/132,983

(22) Filed: Apr. 26, 2002

(65) Prior Publication Data

US 2003/0077530 A1 Apr. 24, 2003

(30) Foreign Application Priority Data

May 2, 2001 (JP) ........................................ 2001-135207

(51) Int. Cl.[7] ............................ G21K 5/10; H01J 37/08
(52) U.S. Cl. .................................. 250/492.22; 250/492.2
(58) Field of Search .......................... 250/492.1, 492.2, 250/492.22, 492.3; 430/30, 296, 942

(56) References Cited

U.S. PATENT DOCUMENTS

| | | | | |
|---|---|---|---|---|
| 4,451,738 A | * | 5/1984 | Smith ....................... | 250/492.2 |
| 6,066,853 A | * | 5/2000 | Nakasuji ..................... | 250/398 |
| 6,323,500 B1 | * | 11/2001 | Yamashita ............. | 250/492.23 |
| 6,441,384 B1 | * | 8/2002 | Kojima .................. | 250/492.23 |
| 6,630,681 B1 | * | 10/2003 | Kojima .................. | 250/492.22 |

FOREIGN PATENT DOCUMENTS

| | | | | |
|---|---|---|---|---|
| JP | 08-017710 | * | 1/1996 | ......... H01L/21/037 |
| JP | 10-289851 | * | 10/1998 | ......... H01L/21/027 |
| JP | 2000-12620 | * | 7/2001 | ......... H01L/21/027 |

OTHER PUBLICATIONS

U.S. Appl. No. 10/170,040, filed Jun. 11, 2002, Shimizu et al.

* cited by examiner

Primary Examiner—Nikita Wells
Assistant Examiner—Christopher M. Kalivoda
(74) Attorney, Agent, or Firm—Klarquist Sparkman, LLP

(57) ABSTRACT

Methods and devices are disclosed for controlling blur resulting from the space-charge effect and geometrical aberration in a charged-particle-beam microlithography apparatus. Based on the pattern-element densities of the exposure units to be transferred to the substrate, a relationship between the total blur and the beam semi-angle, the current density, and/or the beam-acceleration voltage is determined. An optimal beam semi-angle, current density, and/or beam-acceleration voltage is calculated to: (1) minimize the blur during the transfer-exposure of an exposure unit having a certain pattern-element density; (2) make the blur constant during the transfer-exposure of a group of exposure units having various pattern-element densities; or (3) maximize the patterned-beam current during the transfer-exposure of an exposure unit having a certain pattern-element density and blur tolerance. The beam semi-angle, current density, and/or acceleration voltage of the CPB-optical system is then adjusted to the calculated value.

67 Claims, 8 Drawing Sheets

METHODS AND DEVICES FOR CONTROLLING BLUR RESULTING FROM THE SPACE-CHARGE EFFECT AND GEOMETRICAL ABERRATION IN A CHARGED-PARTICLE-BEAM MICROLITHOGRAPHY APPARATUS

FIELD

This disclosure pertains to microlithography (transfer-exposure of a pattern to a sensitive substrate). Microlithography is a key technology used in the fabrication of microelectronic devices such as integrated circuits, displays, and micromachines. More specifically, this disclosure relates to charged-particle-beam (CPB) microlithography utilizing a segmented reticle defining multiple subfields and to a method of transfer-exposure that reduces image blur caused by varying pattern densities among the subfields and that results in improved image formation and increased throughput.

BACKGROUND

One technique of using a charged particle beam to transfer a pattern to a substrate is known as "divided-reticle pattern transfer." Divided-reticle pattern transfer involves dividing a pattern into individual exposure units, termed "subfields," that are defined on a "divided" or "segmented" reticle and exposed in a prescribed order subfield-by-subfield. As the pattern is transferred from the segmented reticle to the substrate, the subfield images are positioned, or "stitched" together, on the substrate so that they collectively form a single contiguous transferred pattern.

Divided-reticle microlithography systems typically utilize "stencil" reticles, comprising a reticle membrane defining numerous openings (or "apertures") that allow transmission of the beam through a charged-particle-beam (CPB) optical system to the substrate. These apertures are shaped according to respective individual pattern elements to be transferred. During transfer-exposure, the stencil reticle is positioned on a reticle stage within the CPB-optical system such that the charged particle beam (or "illumination beam") passes through a subfield of the divided reticle and becomes "patterned" by the distribution and configuration of pattern elements in the illuminated subfield. This "patterned beam" then passes through projection lenses that collectively focus the patterned beam on a corresponding "transfer subfield" on the substrate, which is mounted on a substrate stage located downstream from the reticle stage. After a subfield is exposed, the charged particle beam may be deflected, or the reticle and substrate stages repositioned, to illuminate and transfer the next subfield. The CPB-optical system located upstream of the reticle and used for irradiating the subfields on the reticle is termed the "illumination-optical system," whereas the CPB-optical system located between the reticle and the substrate is termed the "projection-optical system."

As the patterned beam is transmitted through the projection-optical system, some degree of image blur occurs. The degree of blur is influenced by the individual characteristics of the subfield being transferred and by the resolving power of the projection-optical system. The following have been identified as causes of image blur:

(1) geometrical aberration inherent in the projection-optical system itself, or caused by, for example, mechanical irregularities arising during assembly of various components of the projection-optical system and thermal deformations of the projection-optical system arising during operation thereof;

(2) chromatic aberration resulting from energy distributions generated as the CPB passes through the reticle;

(3) image-placement errors during image formation resulting from external forces such as the vibration of the apparatus during exposure; and (4) fluctuations in the image-formation position resulting from the space-charge effect.

Geometrical aberration can be reduced by incorporating various aberration-correcting optics into the projection-optical system. The aberration-correcting optics can be used for reducing mechanical irregularities and for providing effective temperature control for reducing thermal deformation of projection-optical system.

Chromatic aberration is insignificant when stencil-type reticles are used, and thus can be largely ignored for purposes of the present invention.

Image-placement errors during image formation can be reduced by measuring the relative positions of the substrate stage, the reticle stage, and the projection-optical system using an interferometer. The interferometer is connected to a controller of the microlithography apparatus ("exposure apparatus") so that adjustments to the projection-optical system may be made in real time.

Geometrical aberration, chromatic aberration, and apparatus vibration are all causes of image blur directly attributable to the exposure apparatus. Variations in image-formation position caused by the space-charge effect, however, depend from the individual characteristics of the subfield being transferred. Specifically, the distribution of pattern elements in a subfield affects the current of the illumination beam passing through the subfield, thus altering the distribution of space-charge in the patterned beam and changing the influence of the space-charge effect. To date, there have not been effective countermeasures to the variation in space-charge effects caused by varying pattern-element densities during transfer-exposure of multiple patterns using CPB microlithography.

SUMMARY

In view of the shortcomings of conventional apparatus and methods as summarized above, the present invention provides, inter alia, methods, devices, and fabrication processes for calculating and adjusting the image blur caused by the space-charge effect in order to: (1) minimize the blur during transfer-exposure of an exposure unit having a certain pattern-element density; (2) make the blur constant during transfer-exposure of a group of exposure units having various pattern-element densities; or (3) maximize the patterned-beam current during transfer-exposure of an exposure unit having a certain pattern-element density and blur tolerance. As a result of these methods, devices, and fabrication processes, the ability of the CPB microlithography apparatus to achieve the desired image formation is improved, and the overall throughput of the apparatus is increased.

A first aspect of the invention is set forth in the context of a CPB microlithography method. In the microlithography method, a stencil reticle, which defines a pattern to be transferred onto a sensitive substrate, is irradiated with a charged-particle illumination beam and forms a charged-particle patterned beam. The patterned beam is formed by passage of the illumination beam through an exposure unit of the reticle and carries an aerial image of the exposure unit of the reticle. The patterned beam is then projected onto a sensitive surface of a substrate where the aerial image is imprinted onto the sensitive surface. An embodiment of the method comprises determining a relationship between the semi-angle of the patterned beam incident on the substrate and a total blur resulting from the space-charge effect and from geometrical aberration. Adjustments to the semi-angle are made according to the relationship, which varies with changes in the pattern-element density for each exposure unit being transferred.

Calculations may be performed during the step of determining a relationship between the semi-angle and the total blur to determine an optimal value, to which the semi-angle is adjusted. This optimal value may be calculated to: (1) minimize the blur during transfer-exposure of an exposure unit having a certain pattern-element density; (2) make the blur constant during transfer-exposure of a group of exposure units having various pattern-element densities; or (3) maximize the patterned-beam current during transfer-exposure of an exposure unit having a certain pattern-element density and blur tolerance.

A second aspect of the invention is similar to the first aspect, except that instead of determining the relationship between the beam semi-angle and the total blur and adjusting the beam semi-angle according to this relationship, in the second aspect the relationship between the current density of the illumination beam and the total blur is determined, and the current density of the illumination beam is adjusted according to the relationship.

As in the first aspect, calculations in the second aspect may be performed to determine an optimal beam-current density in order to: (1) minimize the blur during transfer-exposure of an exposure unit having a certain pattern-element density; (2) make blur constant during transfer-exposure of a group of exposure units having various pattern-element densities; or (3) maximize the patterned-beam current during transfer-exposure of an exposure unit having a certain pattern-element density and blur tolerance.

A third aspect of the invention is also similar to the first aspect, except that instead of determining the relationship between the beam semi-angle and the total blur and adjusting the beam semi-angle according to this relationship, in the third aspect the relationship between the acceleration voltage of the illumination beam and total blur is determined, and the acceleration voltage of the illumination beam is adjusted according to the relationship.

As in the first aspect, calculations in the third aspect may be performed to determine an optimal beam-acceleration voltage in order to: (1) minimize the blur during transfer-exposure of an exposure unit having a certain pattern-element density; (2) make the blur constant during the transfer-exposure of a group of exposure units having various pattern-element densities; or (3) maximize the patterned-beam current during transfer-exposure of an exposure unit having a certain pattern-element density and blur tolerance.

A fourth aspect of the invention is also similar to the first aspect, except that instead of determining the relationship between the beam semi-angle and the total blur and adjusting the beam semi-angle according to this relationship, in the fourth aspect the relationship among the beam semi-angle, the beam-current density, the beam-acceleration voltage, and the total blur is determined and an adjustment is made to one of or all of these variables according to the relationship.

As in the first aspect, calculations may be performed to determine an optimal beam semi-angle, beam-current density, and/or beam-acceleration voltage in order to: (1) minimize the blur during transfer-exposure of an exposure unit having a certain pattern-element density; (2) make the blur constant during transfer-exposure of a group of exposure units having various pattern-element densities; or (3) maximize the patterned-beam current during transfer-exposure of an exposure unit having a certain pattern-element density and blur tolerance.

Any of these microlithography methods may be performed using a CPB microlithography apparatus wherein the pattern to be transferred is divided into multiple subfields (as exemplary exposure units), defined on a segmented reticle, and transferred subfield-by-subfield to a sensitive substrate where images of the subfields are positioned so as to collectively form the entire pattern.

A fifth aspect of the invention pertains to methods for manufacturing a microelectronic device utilizing any of the microlithographic methods summarized above.

According to a sixth aspect of the invention, CPB microlithography apparatus are provided for transferring a pattern, defined on a reticle segmented into multiple exposure units (e.g., subfields) onto a sensitive substrate and for performing any of the methods summarized above. An embodiment of the apparatus comprises an illumination-optical system, a projection-optical system, a blur-measuring system, a beam-adjustment system configured to calculate adjustments to be made to the illumination beam, and a controller. The controller is configured to control: (1) the beam semi-angle of the patterned beam incident on the substrate; (2) the current density of the illumination beam; and (3) the beam-acceleration voltage of the illumination beam.

Based on calculations made by the beam-adjustment system, one of the beam semi-angle, current density of the illumination beam, or beam-acceleration voltage may then be adjusted to: (1) minimize the blur during transfer-exposure of an exposure unit having a certain pattern-element density; (2) make the blur constant during transfer-exposure of a group of exposure units having various pattern-element densities; or (3) maximize the patterned-beam current during transfer-exposure of an exposure unit having a certain pattern-element density and blur tolerance.

A seventh aspect of the present invention is set forth in the context of a CPB microlithography method, in which large pattern-element regions or regions having non-self-supporting pattern elements are transferred to a substrate. An embodiment of the method comprises dividing the pattern into at least two complementary exposure regions and grouping the divided exposure regions into two groups: (a) exposure regions having smaller apertures, and (b) exposure regions having larger apertures. The exposure regions having smaller apertures are arranged in a first reticle stripe and the exposure regions having larger apertures in a second reticle stripe. Each stripe is transfer-exposed to the substrate using settings optimized for each respective stripe. For instance, the first reticle stripe is transfer-exposed using CPB settings that result in higher-resolution image formation and lower throughput, whereas the second reticle stripe is transfer-exposed using CPB beam settings that result in lower-resolution image formation and higher throughput.

Further, during transfer-exposure of the first reticle stripe, an optimal beam semi-angle, beam-current density, and/or beam-acceleration voltage may be calculated and used to minimize the blur during transfer-exposure.

The foregoing and additional features and advantages of the invention will be more readily apparent from the following detailed description, which proceeds with reference to the accompanying drawings.

DETAILED DESCRIPTION

This invention is described below in connection with representative embodiments that are not intended to be limiting in any way. The embodiments are disclosed in part by flow charts that are particularly useful in explaining certain features of the subject methods. Although the various embodiments are described as utilizing an electron beam as an exemplary charged particle beam, the general principles set forth herein are applicable with equal facility to the use of an alternative charged particle beam such as an ion beam.

General Considerations

Figure 2:
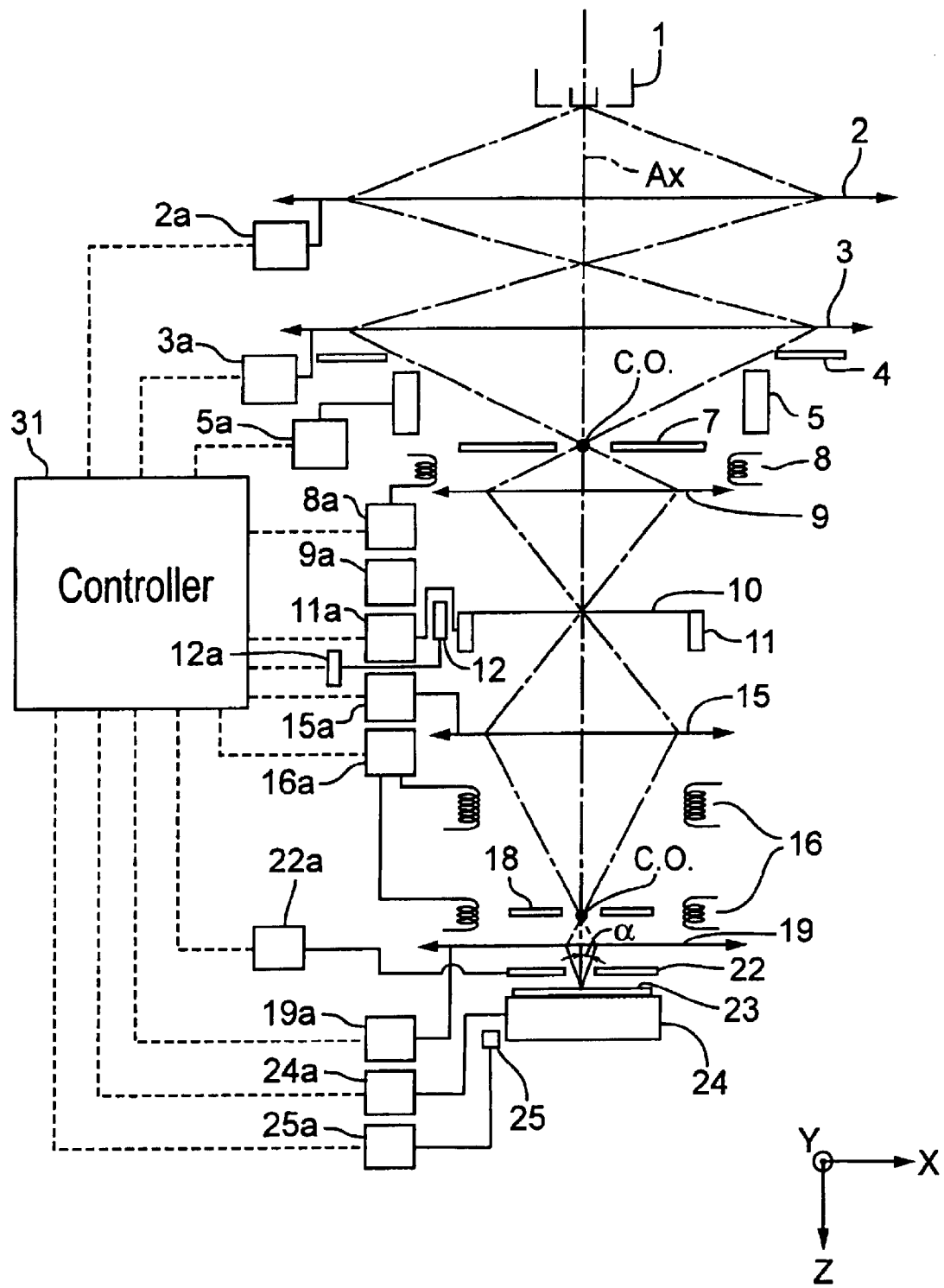
FIG. 2 is an elevational schematic diagram of imaging relationships and control systems of a CPB microlithography apparatus employing a segmented reticle according to the invention.

Reference is first made to FIG. 2, which shows an overview of a CPB divided-reticle projection-microlithography system.

Situated at the extreme upstream end of the system is an electron gun 1 that emits an electron beam propagating in a downstream direction generally along an optical axis Ax. Downstream of the electron gun 1 are a first condenser lens 2 and a second condenser lens 3 collectively constituting a two-stage condenser-lens assembly. The condenser lenses 2, 3 converge the electron beam at a crossover C.O. situated on the optical axis Ax at a blanking diaphragm 7.

Downstream of the second condenser lens 3 is a "beam-shaping diaphragm" 4 comprising a plate defining an axial aperture (typically rectangular in profile) that trims and shapes the electron beam passing through the aperture. The aperture is sized and configured to trim the electron beam sufficiently to illuminate one exposure unit (e.g., a "subfield") on the reticle 10. An image of the beam-shaping diaphragm 4 is formed on the reticle 10 by an illumination lens 9.

The electron-optical components situated between the electron gun 1 and the reticle 10 collectively constitute an "illumination-optical system" of the depicted microlithography system. The electron beam propagating through the illumination-optical system is termed an "illumination beam" because it illuminates a desired region of the reticle 10. As the illumination beam propagates through the illumination-optical system, the beam actually travels in a downstream direction through an axially aligned "beam tube" (not shown but well understood in the art) that can be evacuated to a desired vacuum level.

A blanking deflector 5 is situated downstream of the beam-shaping aperture 4. The blanking deflector 5 laterally deflects the illumination beam as required to cause the illumination beam to strike the aperture plate of the blanking diaphragm 7, thereby preventing the illumination beam from being incident on the reticle 10.

A subfield-selection deflector 8 is situated downstream of the blanking diaphragm 7. The subfield-selection deflector 8 laterally deflects the illumination beam as required to illuminate a desired exposure unit situated on the reticle within the optical field of the illumination-optical system. Thus, exposure units of the reticle 10 are sequentially scanned by the illumination beam in a horizontal direction (X direction in the figure). The illumination lens 9, which forms the image of the beam-shaping diaphragm 4 on the reticle 10, is situated downstream of the subfield-selection deflector 8.

The reticle 10 typically defines many exposure units (e.g., tens of thousands of subfields). The exposure units collectively define the pattern for a layer to be formed at a single die ("chip") on a lithographic substrate. The reticle 10 is mounted on a movable reticle stage 11. Using the reticle stage 11, by moving the reticle 10 in a direction (Y and/or X direction) perpendicular to the optical axis Ax, it is possible to illuminate the respective exposure units on the reticle 10 extending over a range that is wider than the optical field of the illumination-optical system. The position of the reticle stage 11 in the XY plane is determined using a "position detector" 12 typically configured as a laser interferometer. The laser interferometer is capable of measuring the position of the reticle stage 11 with extremely high accuracy in real time.

Situated downstream of the reticle 10 are first and second projection lenses 15, 19, respectively, and an imaging-position deflector 16. The illumination beam, by passage through an illuminated exposure unit of the reticle 10, becomes a "patterned beam" because the beam has acquired an aerial image of the illuminated subfield. The patterned beam is imaged at a specified location on a substrate 23 (e.g., "wafer") by the projection lenses 15, 19 collectively functioning as a "projection-lens assembly." To ensure imaging at the proper location, the imaging-position deflector 16 imparts the required lateral deflection of the patterned beam.

So as to be imprintable with the image carried by the patterned beam, the upstream-facing surface of the substrate 23 is coated with a suitable "resist" that is imprintably sensitive to exposure by the patterned beam. When forming the image on the substrate, the projection-lens assembly "reduces" (demagnifies) the aerial image. Thus, the image as formed on the substrate 23 is smaller (usually by a defined integer-ratio factor termed the "demagnification factor") than the corresponding region illuminated on the reticle 10. By thus causing imprinting on the surface of the substrate 23, the apparatus of FIG. 2 achieves "transfer" of the pattern image from the reticle 10 to the substrate 23.

The components of the depicted electron-optical system situated between the reticle 10 and the substrate 23 are collectively termed the "projection-optical system." The substrate 23 is situated on a substrate stage 24 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 15. The position of the crossover C.O. on the optical axis Ax is a point at which the axial distance between the reticle 10 and substrate 23 is divided according to the demagnification ratio. Situated between the crossover C.O. (i.e., the rear focal plane) and the reticle 10 is a contrast-aperture diaphragm 18. The contrast-aperture diaphragm 18 comprises an aperture plate that defines an aperture centered on the axis Ax. With the contrast-aperture diaphragm 18, electrons of the patterned beam that were scattered during transmission through the reticle 10 are blocked so as not to reach the substrate 23.

The illumination beam's semi-angle a incident on the substrate is measured between the second projection lens 19 and the substrate 23. The semi-angle can be changed by adjusting projection lenses 15 and 19 and/or the contrast-aperture diaphragm 18. As will be explained with reference to FIG. 5, the projection-optical system also includes a blur-measuring system located at the periphery of the system.

A backscattered-electron (BSE) detector 22 is situated immediately upstream of the substrate 23. The BSE detector 22 is configured to detect and quantify electrons backscattered from certain marks situated on the upstream-facing surface of the substrate 23 or on an upstream-facing surface of the substrate stage 24. For example, a mark on the substrate 23 can be scanned by a beam that has passed through a corresponding mark pattern on the reticle 10. By detecting backscattered electrons from the mark at the substrate 23, it is possible to determine the relative positional relationship of the reticle 10 and the substrate 23.

The substrate 23 is mounted to the substrate stage 24 via a wafer chuck (not shown but well understood in the art), which presents the upstream-facing surface of the substrate 23 in an XY plane. The substrate stage 24 (with chuck and substrate 23) is movable in the X and Y directions. Thus, by simultaneously scanning the reticle stage 11 and the substrate stage 24 in mutually opposite directions, it is possible to transfer each exposure unit within the optical field of the illumination-optical system as well as each exposure unit outside the optical field to corresponding regions on the substrate 23. The substrate stage 24 also includes a "position detector" 25 configured similarly to the position detector 12 of the reticle stage 11.

Each of the lenses 2, 3, 9, 15, 19 and deflectors 5, 8, 16 is controlled by a controller 31 via a respective coil-power controller 2a, 3a, 9a, 15a, 19a and 5a, 8a, 16a. Similarly, the reticle stage 11 and substrate stage 24 are controlled by the controller 31 via respective stage drivers 11a, 24a. The position detectors 12, 25 produce and route respective stage-position signals to the controller 31 via respective interfaces 12a, 25a each including amplifiers, analog-to-digital (A/D) converters, and other circuitry for achieving such ends. In addition, the BSE detector 22 produces and routes signals to the controller 31 via a respective interface 22a.

From the respective data routed to it, the controller 31 ascertains, inter alia, any control errors of the respective stage positions as a subfield is being transferred. To correct such control errors, the imaging-position deflector 16 is energized appropriately to deflect the patterned beam. Thus, a reduced image of the illuminated exposure unit on the reticle 10 is transferred accurately to the desired target position on the substrate 23. This real-time correction is made as each respective image of an exposure unit is transferred to the substrate 23, and the images are positioned such that they are properly stitched together on the substrate 23.

Figure 3A:
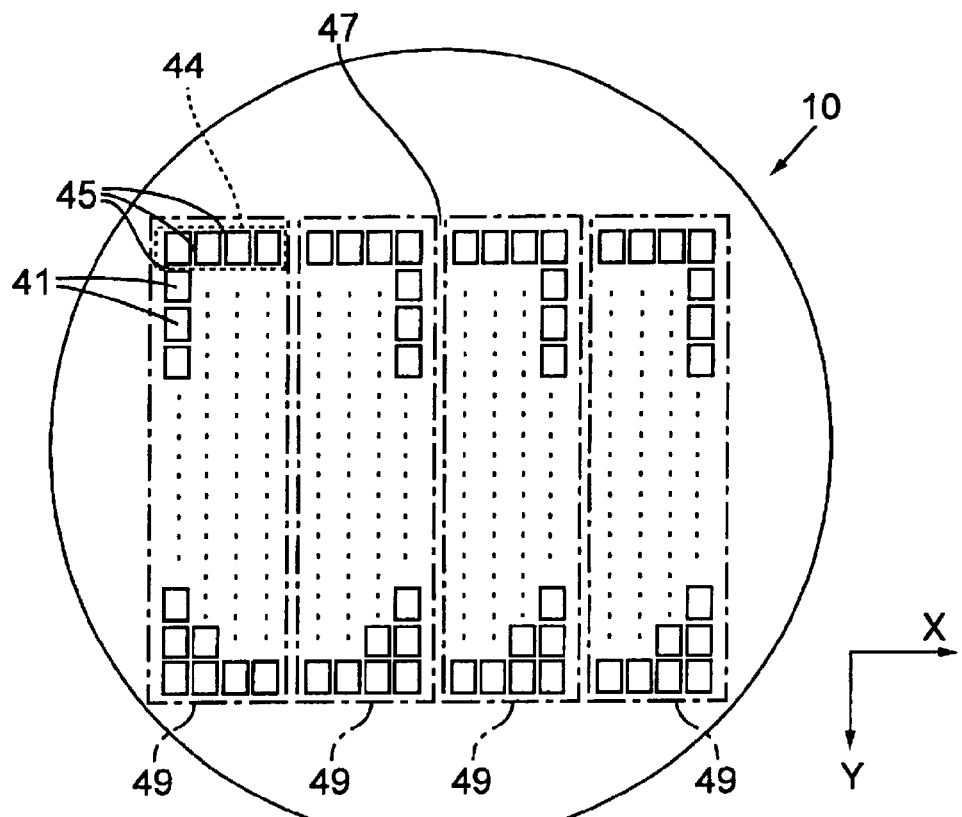
FIG. 3(A) is a plan view showing general aspects of a segmented reticle as used, for example, in the apparatus of FIG. 2.
Figure 3B:
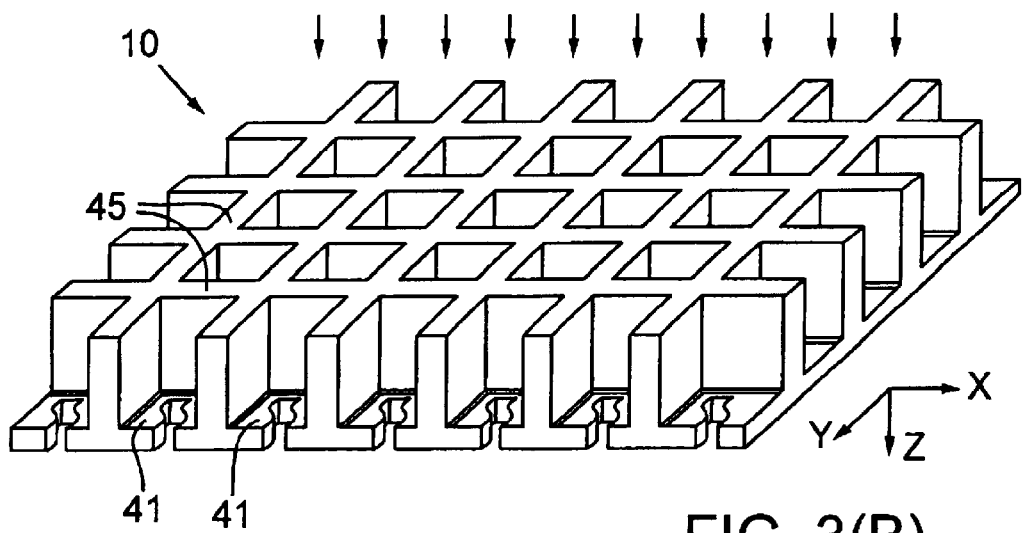
FIG. 3(B) is an oblique view of a portion of the reticle shown in FIG. 3(A).
Figure 3C:
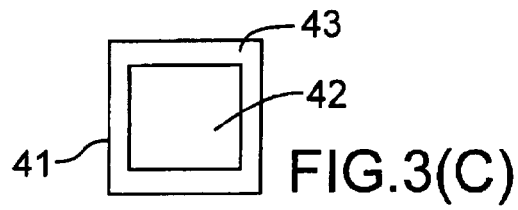
FIG. 3(C) is a plan view of a single subfield of the reticle of FIG. 3(A).

Details of an exemplary divided reticle 10 as used with the system of FIG. 2 are shown in FIGS. 3(A)–3(C). FIG. 3(A) is a plan view, FIG. 3(B) is an oblique view of a portion of the reticle, and FIG. 3(C) is a plan view of a single subfield (as a representative exposure unit). The depicted reticle 10 can be manufactured by electron-beam direct writing and etching of a silicon wafer, for example.

FIG. 3(A) shows the general configuration of the entire reticle 10. In the figure, multiple regions 49 are shown each including a large respective array of subfields 41. The regions 49 are termed "stripes," and each stripe 49 extends in the Y direction. Each stripe 49 includes multiple rows 44 of subfields 41, wherein each row 44 extends in the X direction. Each subfield 41 comprises a respective portion of the reticle membrane. Depending somewhat upon the particular type of reticle (stencil reticle or scattering-membrane reticle), the membrane has a thickness of, e.g., 0.1 $\mu$m to several $\mu$m. In the depicted configuration, the subfields 41 in each row 44 (and the rows 44 in each stripe 49) are separated from each other by respective "minor struts" 45. The stripes 49 are separated from each other by major struts 47.

As shown in FIG. 3(C), each subfield 41 comprises a respective pattern-defining region 42 surrounded by a skirt 43. In a particular subfield 41, the respective pattern-defining region 42 defines the pattern features of the respective portion of the pattern defined by that subfield 41. The skirt 43 is not patterned. During exposure of the particular subfield 41, only the respective pattern-defining region 42 is transferred; the respective skirt 43 is not transferred. The edges of the illumination beam incident on the subfield fall within the respective skirt 43. As discussed above, the reticle 10 can be a stencil type or a scattering-membrane type. I.e., either type of reticle 10 can be used with the apparatus of FIG. 2, for example.

The currently practicable size of the membrane area 42 of a single subfield 41 is approximately 0.5 to 5 mm square on the reticle 10. At a demagnification ratio of 1/5, for example, the size of the reduced subfield image as projected onto the substrate 23 is approximately 0.1 to 1 mm square.

The minor struts 45 intersect with each other at right angles to form a lattice of "grillage" that strengthens and confers rigidity to the reticle 10. By way of example, the minor struts 45 are each about 0.5 to 1 mm thick (in the Z direction) and about 0.1 mm wide (in the X or Y direction); the skirt 43 is about 0.05 mm wide, for example. The grillage includes the major struts 47 that confer additional rigidity and strength to the reticle 10. The major struts 47 are contiguous with the minor struts 45.

The rows 44 shown in FIG. 3(A) are also known as "electrical stripes" because exposure of each row involves an electrically induced deflection of the illumination and patterned beams using the subfield-selection and imaging-position deflectors 8, 16, respectively. Similarly, the stripes 49 shown in FIG. 3(A) are also known as "mechanical stripes" because exposure of a full stripe 49 involves mechanical movement of the reticle 10 and substrate 23 by the reticle stage 12 and substrate stage 24, respectively. Hence, multiple subfields 41 are arrayed in the X direction in the figure to form each electrical stripe 44, and multiple electrical stripes 44 are arrayed in the Y direction to form each mechanical stripe 49. The length of an electrical stripe 44 (equal to the width of the corresponding mechanical stripe 49) corresponds to the width of the optical field of the illumination-optical system (which corresponds to the width of a range of deflection achievable by the subfield-selection deflector 8).

As an alternative to the reticle configuration shown in FIGS. 3(A)–3(C), a segmented reticle can comprise electrical stripes in which the respective subfields are not separated from each other. In other words, in such an alternative reticle, the constituent subfields of each electrical stripe are contiguous with each other with no intervening minor struts 45 or skirts 43. However, minor struts 45 (and skirts) are still present between adjacent electrical stripes of a mechanical stripe, and major struts 47 are still present between adjacent mechanical stripes. During exposure of this type of segmented reticle, the constituent subfields of an electrical stripe are exposed in a continuous lateral scanning sweep of the illumination beam along the electrical stripe.

According to an effective exposure method, and referring further to the reticle 10 shown in FIG. 3(A), the subfields 41 in a selected electrical stripe 44 within a selected mechanical stripe 49 are sequentially illuminated by appropriate deflections of the illumination beam in the X direction. Successive electrical stripes 44 in the selected mechanical stripe 49 are exposed by continuous scanning motions of the stages 11, 24.

Figure 4:
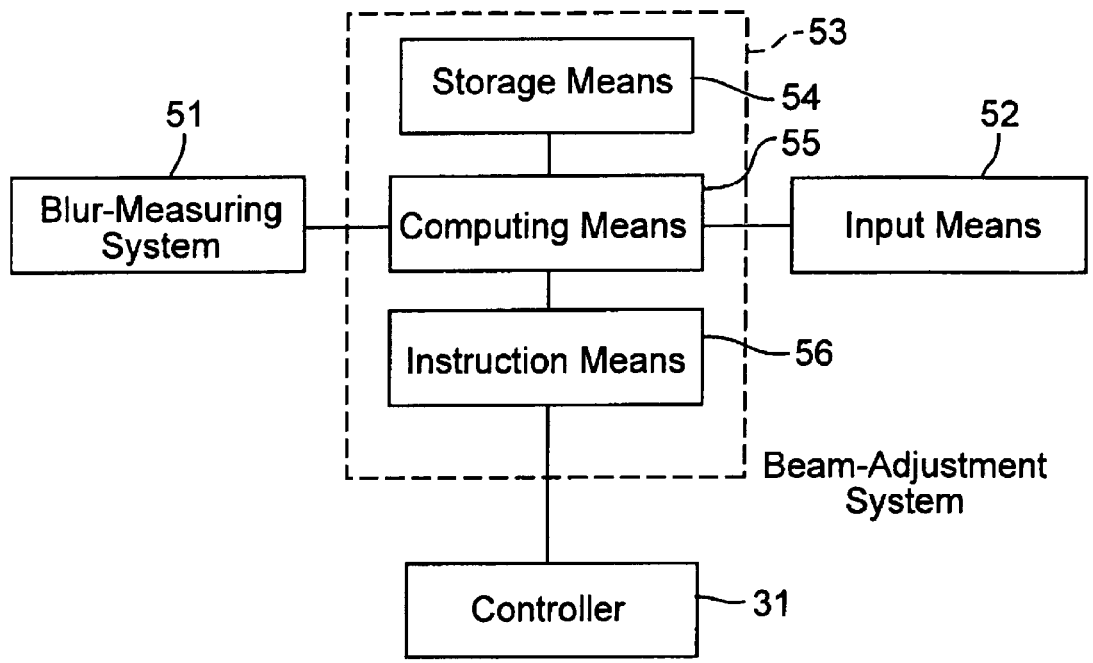
FIG. 4 is a block diagram depicting a control system for a CPB microlithography apparatus according to a first representative embodiment.

FIG. 4 is a block diagram depicting an embodiment of a control system for a CPB microlithography apparatus. A blur-measuring system 51 is provided to measure the blur of the projected image. An input means 52 (e.g., a keyboard or other data source) is provided to allow for the input of commands and parameters that change the settings of the CPB microlithography apparatus and that influence the space-charge of the patterned beam. Data from the blur-measuring system 51 and input means 52 are routed to a beam-adjustment system 53 that calculates the adjustments to be made to the illumination beam. Data from the beam-adjustment system 53 are routed to the controller 31, which makes the necessary adjustments to the lenses, deflectors, and stages of the CPB-optical system.

The beam-adjustment system 53 is comprised of a storage means 54 for storing the necessary algorithms and parameters related to the magnitude of blur caused by the space-charge effect and geometrical aberration; a computing means 55 for calculating the amount of blur based on the algorithms and parameters stored in the storage means 54 and the data obtained from the blur-measuring system 51; and an instruction means 56 that instructs the controller 31 to make an adjustment to the CPB-optical system based on the calculations performed by the computing means 55.

Figure 5:
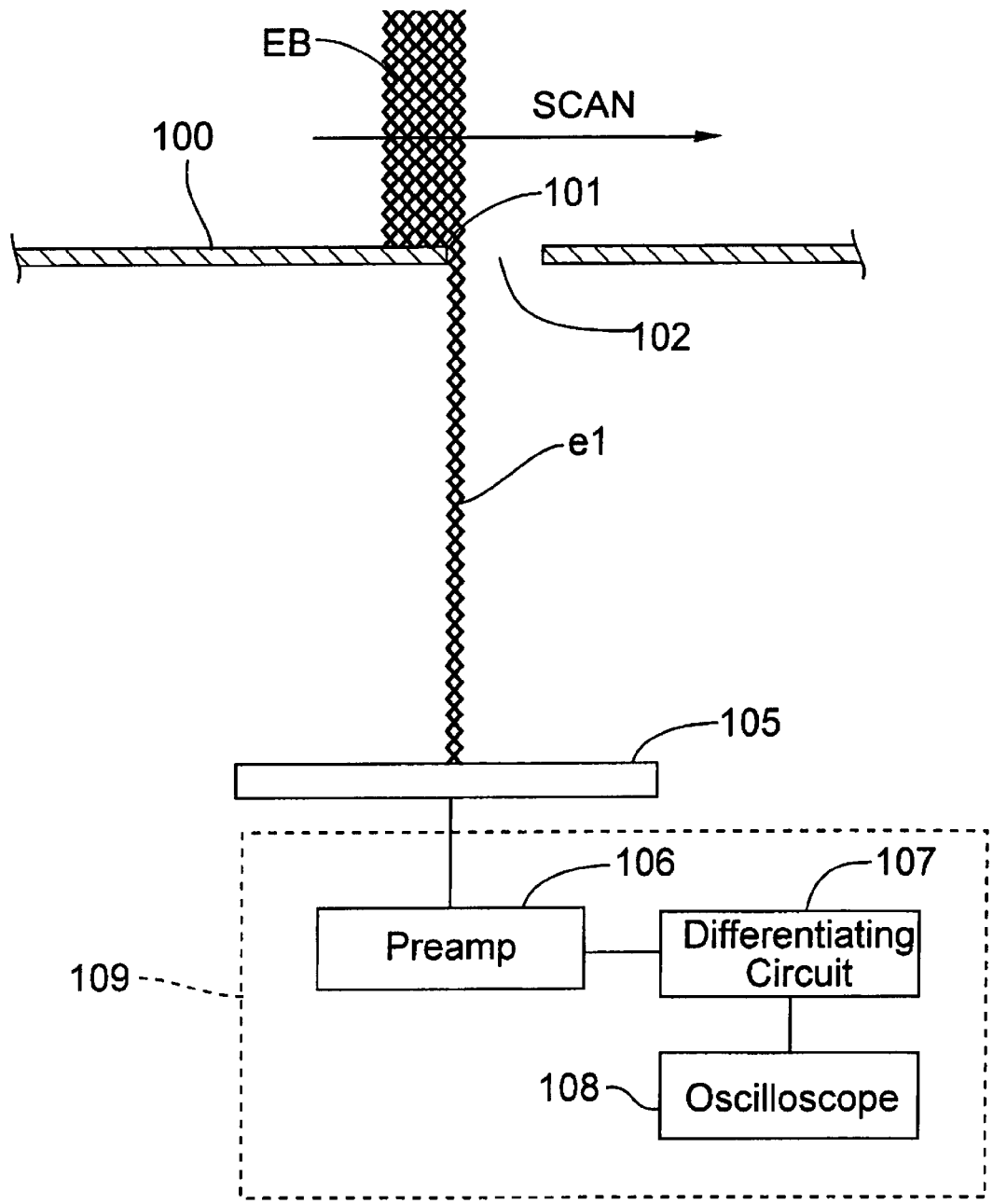
FIG. 5 is a schematic elevational view of a blur-measurement system with an accompanying block diagram.

Details of the blur-measuring system 51 are shown in FIG. 5. This method for measuring blur is disclosed, for example, in Japan Kôkai Patent Document No. Hei 10-289851 and in Japan Patent Application No. 2000-12620.

In FIG. 5, it will be understood that an illumination-beam source and a reticle, although not shown, are located upstream of the components shown in the figure. The reticle, in addition to defining the pattern to be transferred to the substrate, also defines a pattern of measurement marks. The beamlet EB depicted in FIG. 5 is the small electron beam produced by transmission of the illumination beam through a measurement mark on the reticle (not shown). The measurement mark typically is rectangular in profile, in which instance the beamlet EB that has passed through the measurement mark has a rectangular transverse profile. The beamlet EB is incident on a plate 100 that defines a "knife-edged" reference mark 102. The reference mark 102 typically is rectangular in profile (the entire mark is not shown) and is configured as a respective through-hole defined by the plate 100. The beamlet EB is incident in a scanning manner on a knife-edge 101 of the mark 102, wherein the knife-edge 101 is configured as in the well-known "knife-edge" test for evaluating the quality of an aerial image. An electron detector (sensor) 105 is disposed downstream of the mark 102.

As the beamlet EB is scanned in a direction indicated by a respective arrow (labeled "SCAN"; e.g., extending to the right in FIG. 5), electrons of the beamlet EB incident on the plate 100 are absorbed. On the other hand, electrons incident on the reference mark 102 are transmitted (beamlet "e1") through the reference mark and are detected by the electron detector 105.

After being detected by detector 105, the beam current of electrons e1 is amplified by a pre-amplifier 106, converted by a differentiation circuit 107 (wherein the conversion is to percent change versus time) to an output waveform, and displayed on an oscilloscope 108 or analogous display. Image blur is determined from the output waveform produced by the differentiation circuit 107. From the determined blur, appropriate corrective adjustments (e.g., of focal point, astigmatism, magnification, rotation, etc.) and an evaluation of the image forming ability of the beam can be made by the beam-adjustment system 53 shown in FIG. 4.

The following equation gives an extremely good approximation of the blur caused by the space-charge effect:

$$\text{blur} = \frac{I^{\frac{5}{6}} L^{\frac{5}{4}} M}{\alpha^{\frac{3}{5}} (SF)^{\frac{1}{2}} V^{\frac{3}{2}}}$$

In the equation, I is the beam current that has passed through the reticle 10 (i.e., the "patterned-beam current"); L is the axial distance between the substrate 23 and reticle 10; M is the demagnification ratio; α is the semi-angle of the beam incident on the substrate 23 (see FIG. 2); SF is the area of the exposure unit (width×height); and V is the acceleration voltage of the illumination beam.

It should be noted that the values of the powers to which the respective variables are raised are not limited to the ones listed and that other values have been proposed.

In the above equation, the patterned-beam current I is obtained by multiplying the illumination-beam current $I_{in}$ incident on the reticle 10 with the electron transmissivity of the subfield. The electron transmissivity is the percentage of the illumination beam that is transmitted through the apertures of the stencil reticle. The electron transmissivity is directly related to the pattern-element density of the exposure unit. Therefore, the patterned-beam current I, and thus the blur caused by the space-charge effect, are dependent on the particular shape and pattern-element distribution of each exposure unit being transferred.

First Representative Embodiment

This embodiment is explained with reference to FIG. 1. For purposes of understanding the features of this embodiment, assume that the variables of the above equation are as follows: the illumination-beam current incident to the reticle ($I_{in}$) is 100 mA; the electron transmissivities of four exemplary exposure units ("subfields" in this embodiment) are 5%, 10%, 20%, and 25%, respectively, resulting in patterned-beam currents (I) of 5 μA, 10 μA, 20 μA, and 25 μA, respectively; the axial distance (L) between the substrate 23 and the reticle 10 is 600 mm; the demagnification ratio of the projection-optical system is 1/4; the area of the subfield SF (width×height) is 250 mm; and the beam-acceleration voltage (V) is 100 kV. These specific values are assumed for exemplary purposes only and are not intended to be limiting.

Figure 1:
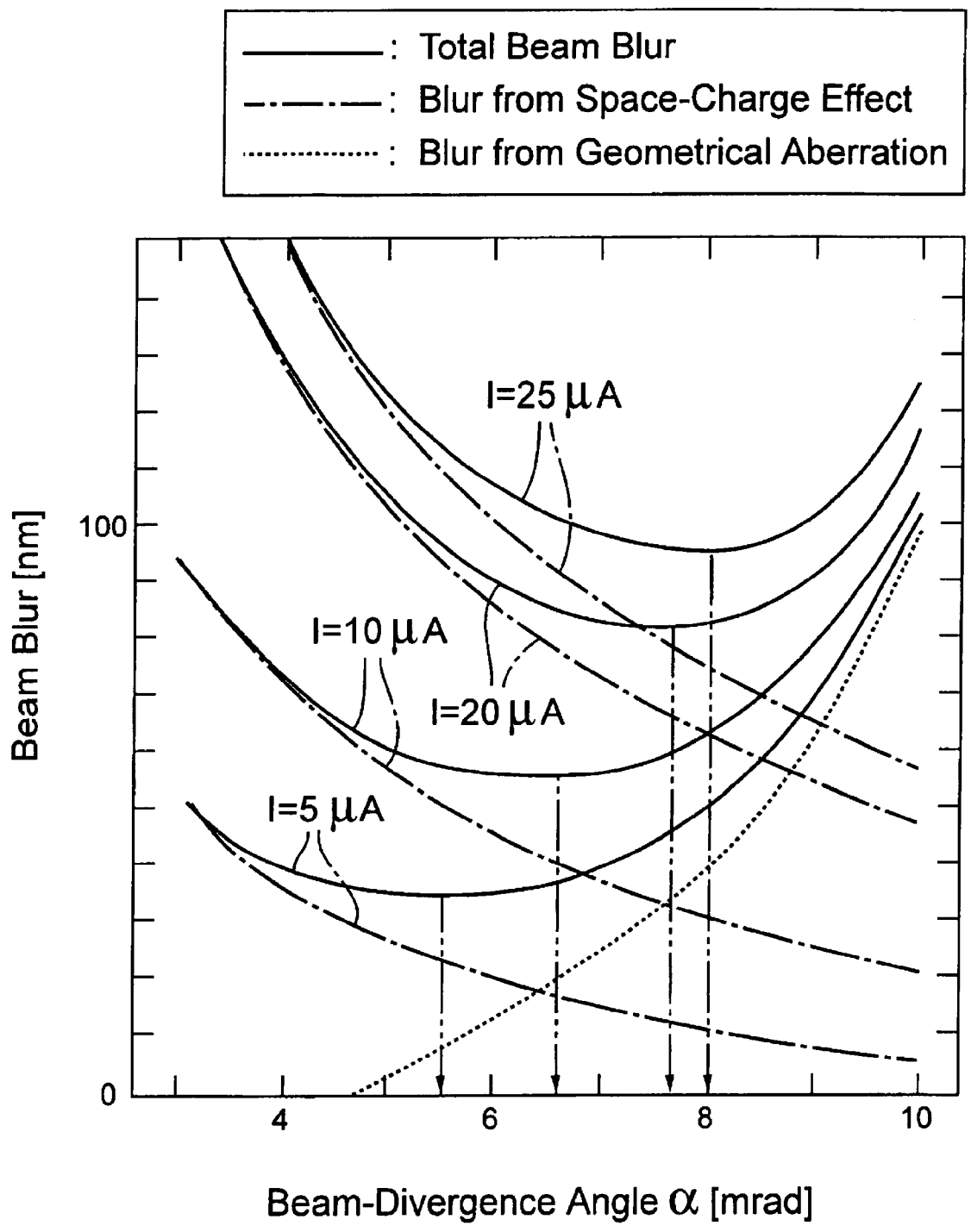
FIG. 1 is a graph showing the relationship between the beam semi-angle and blur at various beam currents.

FIG. 1 is a graph showing the relationship between the beam semi-angle and blur at the various denoted beam currents. Specifically, the horizontal axis of FIG. 1 corresponds to the beam semi-angle α, measured in mrad, while the vertical axis corresponds to the amount of blur, measured in nm. The four solid-line curves depict the respective relationship of the beam semi-angle with the blur at beam currents 5 μA, 10 μA, 20 μA, and 25 μA. It should be noted that the blur resulting from apparatus vibration, etc., is not dependent on the beam semi-angle, and thus has been excluded from the graph.

The curves denoted by alternating long- and short-dashed lines are of respective blur resulting from the space-charge effect at the four different beam currents as calculated by the equation above. These curves show that, as the beam semi-angle increases, the blur resulting from the space-charge effect decreases. For example, for a patterned beam having a patterned-beam current (I) of 10 μA, the blur resulting from the space-charge effect is 70 nm when the beam semi-angle is 4 mrad and is 20 nm when the beam semi-angle is 10 mrad. As can be seen, blur caused by the space-charge effect is relatively proportional to the patterned-beam current (I), decreasing as the patterned-beam current decreases and increasing as the patterned-beam current increases.

The dashed curve in FIG. 1 denotes the blur resulting from geometrical aberration. Because the blur resulting from geometrical aberration is largely unaffected by the patterned-beam current, the dashed line represents the blur resulting from geometrical aberration at all respective patterned-beam currents. The dashed curve shows that blur resulting from geometrical aberration increases exponentially as the beam semi-angle increases. For example, blur resulting from geometrical aberration is 3 nm when the beam semi-angle is 5 mrad and is 95 nm when the beam semi-angle is 10 mrad. Blur resulting from geometrical aberration can be calculated through simulations using the CPB-optical system parameters.

The solid-line curves in FIG. 1 represent respective total blur at the noted beam currents. The total blur is calculated as follows:

$$\text{total blur} = \sqrt{(\text{space} - \text{charge} - \text{effect blur})^2 + (\text{geometrical aberration blur})^2}$$

Because the blur resulting from the space-charge effect decreases exponentially as the beam semi-angle increases, and because the blur resulting from geometric aberration increases exponentially as the beam semi-angle increases, the total blur at each beam current is a respective parabolic curve as shown by FIG. 1.

For example, for a patterned-beam current (I) of 5 μA, total blur is 40 nm when the beam semi-angle is 4 mrad and is 97 nm when the beam semi-angle is 10 mrad. The total blur reaches a minimum of 30 nm when the beam semi-angle is 5.5 mrad.

Similarly, for a patterned-beam current (I) of 10 μA, the total blur reaches a minimum of 53 nm when the beam semi-angle is 6.6 mrad; for a patterned-beam current of 20 μA, total blur reaches a minimum of 80 nm when the beam semi-angle is 7.6 mrad; and for a patterned-beam current of 25 μA, total blur reaches a minimum of 92 nm when the beam semi-angle is 8.0 mrad. Thus, by varying the beam semi-angle between 5 mrad and 8 mrad, the total blur can be minimized for patterned-beam currents between 5 μA and 25 μA.

Figure 6:
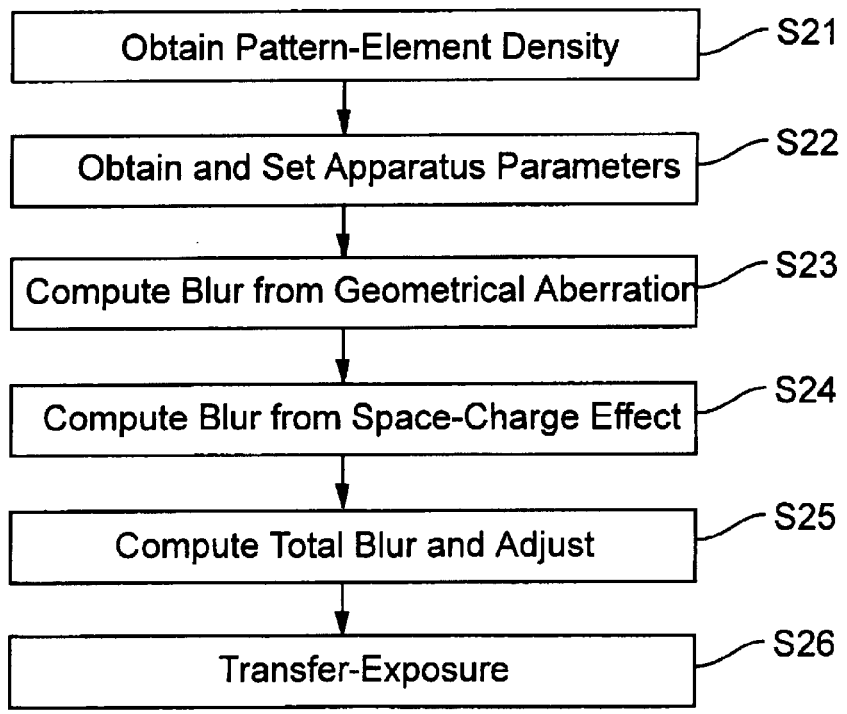
FIG. 6 is a process flowchart for performing a microlithography method according to a first representative embodiment.

FIG. 6 is a process flowchart for a microlithography method according to this first embodiment.

At step S21, data relating to the pattern-element density of each subfield is obtained. It will be understood that these data are calculated in advance. For patterns having constant pattern-element densities across the subfields (e.g., memory cells), the average pattern density may be obtained and used. For patterns having varied pattern-element densities across the subfields (e.g., logic circuits), the respective pattern-element density for each subfield may be obtained and used. With reference to FIG. 4, the pattern-element density data are input by the input means 52 and stored in the storage means 54 of the beam-adjustment system 53.

At step S22, various parameters of the CPB-optical system are obtained and set. Specifically, the illumination-beam current $I_{in}$, the axial distance L between the substrate 23 and the reticle 10, the demagnification ratio M, the subfield area SF, and the beam-acceleration voltage V are obtained and set. These parameters are also stored in the storage means 54 of the beam-adjustment system 53.

At step S23, the blur resulting from geometrical aberration (the dashed-line curve in FIG. 1) is calculated based on the data input at steps S21 and S22.

At step S24, the blur resulting from the space-charge effect (the curves denoted by alternating long- and short-dashed lines in FIG. 1) is calculated based on the data input at steps S21 and S22.

At step S25, the total blur is calculated from the blur resulting from geometrical aberration and the blur resulting from the space-charge effect (the solid-line curves in FIG. 1). Then, in this embodiment, the beam semi-angle α that minimizes the total blur for the particular patterned-beam current I is calculated. Finally, the CPB-optical system is adjusted to achieve this optimal beam semi-angle. The beam semi-angle can be altered by adjusting the projection lenses 15 and 19 (e.g., calibration of focal point, astigmatism, magnification, rotation, and/or other parameters) and/or the contrast-aperture diaphragm 18.

At step S26, exposure is performed using the optimal beam semi-angle. For patterns having constant pattern-element densities among their subfields (e.g., memory cells), the beam semi-angle may be set to one value for the entire pattern transferred. For patterns having complex and varied pattern-density distributions among their subfields (e.g., logic circuits), the beam semi-angle may be altered for each subfield exposed, thereby resulting in improved pattern resolution.

Second Representative Embodiment

Figure 7:
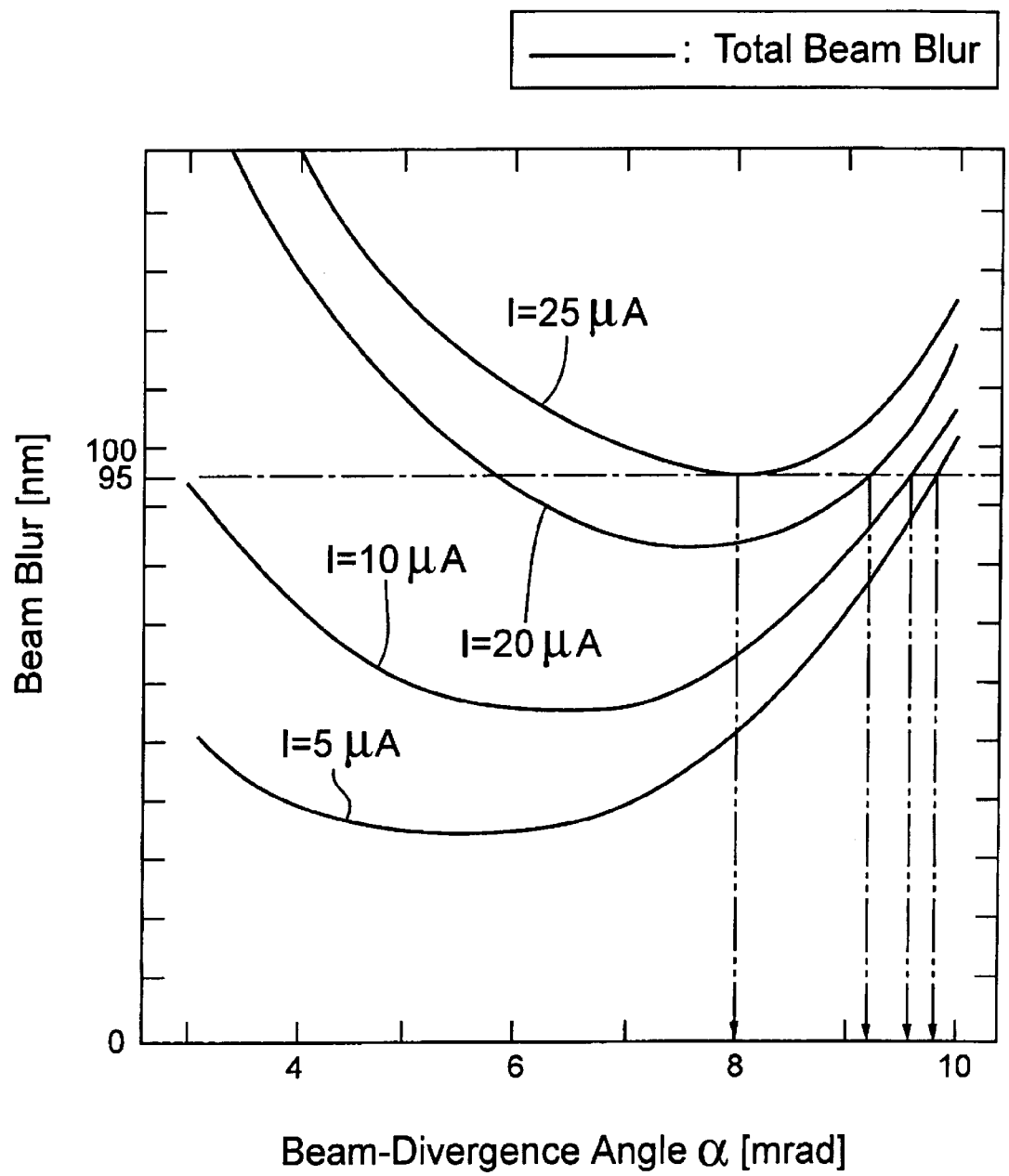
FIG. 7 is a graph showing the relationship between the beam semi-angle and blur at various beam currents according to a first representative embodiment.

This embodiment is explained with reference to FIG. 7. As with FIG. 1, FIG. 7 shows respective relationships between the beam semi-angle α(mrad) and the total blur (nm) at the patterned-beam currents (I) of 5 μA, 10 μA, 20 μA, and 25 μA. For example, when the beam semi-angles are respectively set to 9.8, 9.6, 9.2, and 8.0 mrad, and when the corresponding beam currents are 5 μA, 10 μA, 20 μA, and 25 μA, the total blur is approximately 95 nm for all respective beam currents. Therefore, it is possible to maintain a constant blur by adjusting the beam semi-angle during transfer-exposure of a group of subfields or other exposure units having varied pattern-element densities that affect the patterned-beam current. Accordingly, it is possible to obtain a writing line of stable width, even when the pattern-element densities of the exposed subfields are not constant.

Further, the microlithography method described above and shown in FIG. 6 may be adapted to perform CPB microlithography according to the various features of this embodiment.

Third Representative Embodiment

Figure 8:
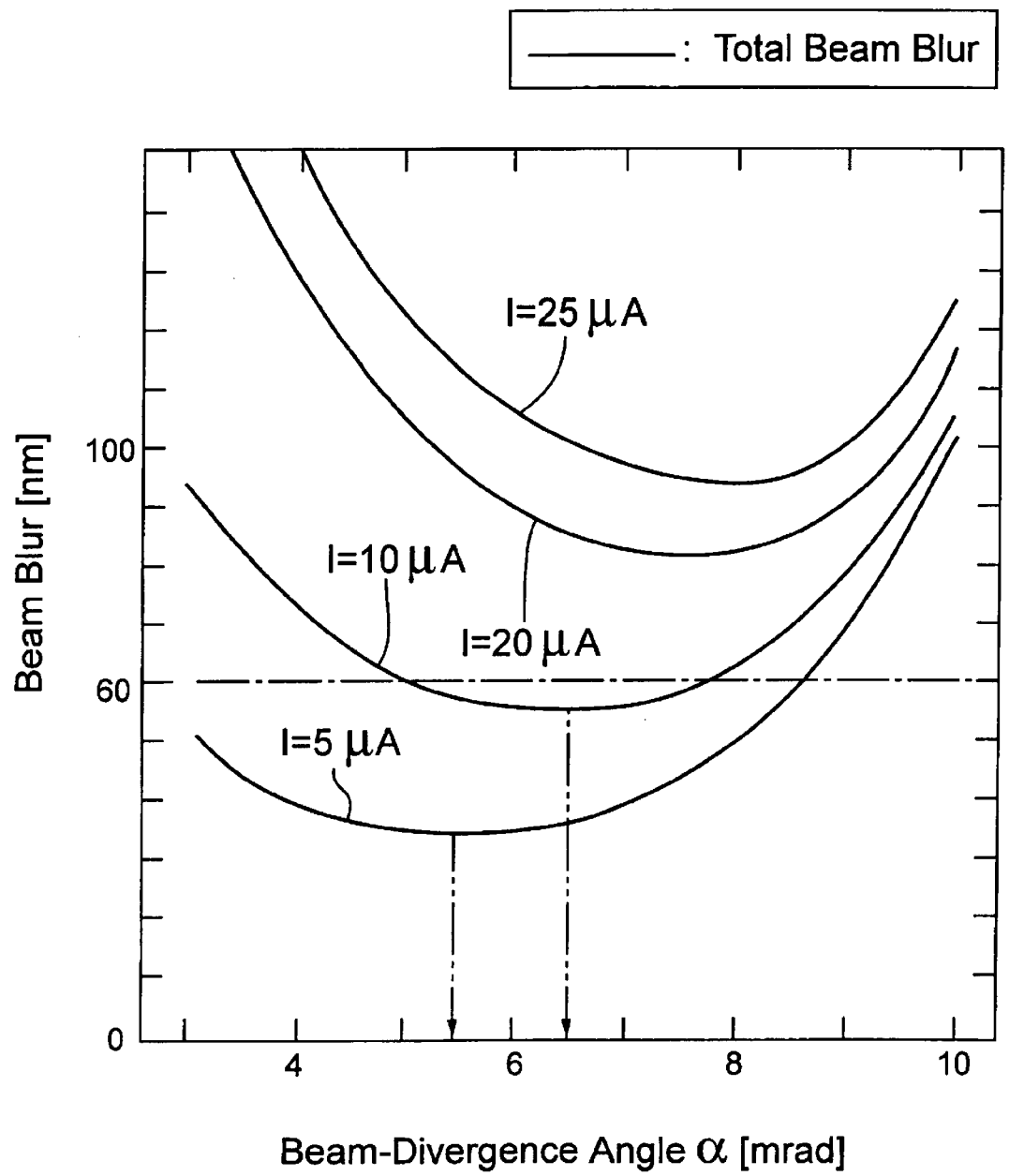
FIG. 8 is a graph showing the relationship between the beam semi-angle and blur at the assumed beam currents according a second representative embodiment.

This embodiment is explained with reference to FIG. 8. As with FIG. 1, FIG. 8 shows respective relationships between the beam semi-angle α (mrad) and the total blur (nm) at patterned-beam currents (I) of 5 μA, 10 μA, 20 μA, and 25 μA. As shown in FIGS. 1 and 8, blur generally decreases as the patterned-beam current decreases. Exposure time, however, increases with lower beam currents, resulting in decreased throughput. Therefore, it is desirable to maximize the patterned-beam current within a certain tolerance range for blur.

For example, if the blur tolerance of the pattern is 60 nm, patterned-beam currents of 20 μA or 25 μA always will exhibit a total blur exceeding 60 nm, even if the beam semi-angle is adjusted. On the other hand, plots of patterned-beam currents of 5 μA or 10 μA have portions of their curves below the 60 nm line, indicating that proper exposure is possible if the beam semi-angle is adjusted correctly. Here, it is desirable to select the higher beam current value of 10 μA and to adjust the beam semi-angle to approximately 6.6 mrad to minimize the total blur while maximizing the patterned-beam current. By using higher beam currents for patterns having relatively high blur tolerances, throughput can be improved.

Further, the microlithography method described above and shown in FIG. 6 may be adapted to perform CPB microlithography according to the various features of this embodiment.

Fourth Representative Embodiment

Whenever a stencil reticle is used to transfer a pattern, extremely large pattern portions or pattern portions containing non-self-supporting regions (e.g., "donut," "island," or "peninsular" regions) must be divided and arranged into at least two complementary exposure units in order to achieve pattern transfer. Usually, after a pattern is divided in this manner, some of the complementary exposure units contain apertures having smaller dimensions, requiring that transfer be performed at higher resolution. Other exposure units contain apertures having larger dimensions; such exposure units may be transferred at higher beam currents for increased throughput.

According to this embodiment, two groups of exposure units are formed after a pattern is complementarily divided: (1) exposure units having smaller pattern-element apertures; and (2) exposure units having larger pattern-element apertures. Each group is arranged within a respective stripe of like exposure units. Therefore, whenever a stripe containing small-aperture exposure units is exposed, the CPB-optical system can be set to use a lower beam current and have a beam semi-angle that achieves minimal blur. Similarly, whenever a stripe containing large-aperture exposure units is exposed, the CPB-optical system can be set to use a higher beam current, thereby allowing for increased throughput. Thus, whenever a pattern must be complementarily divided, exposure performance can be dramatically improved by concentrating patterns requiring higher resolution into a respective stripe.

Fifth Representative Embodiment

For purposes of explaining this embodiment, assume that the settings of the CPB microlithography apparatus and reticle are the same as those of the first representative embodiment. In the fifth representative embodiment, the current density of the illumination beam can be altered by adjusting the condenser lenses 2 and 3 located upstream of the beam-shaping diaphragm 4.

As shown in FIG. 1, if the beam semi-angle is 8 mrad, and the maximum blur tolerance allowed for exposure is 95 nm, a patterned-beam current (I) of up to 25 μA can be used. Hence, for a reticle having an electron transmissivity of 25%, the illumination-beam current ($I_{in}$) can be a maximum of 100 μA. Similarly, for a reticle having an electron transmissivity of 5%, the illumination-beam current ($I_{in}$) can be 500 μA. As a result of this higher beam current, the time to expose a reticle having an electron transmissivity of 5% is up to five times shorter than the time to expose a reticle having an electron transmissivity of 25%. Therefore, by changing the current density of the illumination beam, it is possible to reduce the time required to expose regions with lower pattern-element densities and dramatically improve throughput.

Consequently, when exposing patterns with different pattern-element densities, the patterned-beam current can be held constant by changing the current density of the illumination beam ($I_{in}$). Thus, if the beam semi-angle is constant, the blur also will be constant. Accordingly, the width of the writing line can be made constant, even if the pattern-element densities of the exposure units change.

Further, like the methods of changing the beam semi-angle discussed above, the current density may be adjusted to minimize the blur or to maximize the beam current within a certain blur tolerance.

Moreover, the microlithography method described above and shown in FIG. 6 may be adapted to perform CPB microlithography according to the various features of this embodiment.

Sixth Representative Embodiment

For purposes of explaining this embodiment, assume that the settings of the CPB microlithography apparatus and reticle are the same as those of the first representative embodiment. In the sixth representative embodiment, the acceleration voltage of the illumination beam can be altered by making adjustments to the electron gun 1.

By changing the acceleration voltage of the illumination beam, and thereby changing the velocity of the charged particles of the illumination beam as incident on the reticle, the blur caused by the space-charge effect can be altered. Therefore, like the methods of changing the beam semi-angle discussed above, adjustments to the beam-acceleration voltage can be made to minimize the blur, to make the blur constant during transfer exposure of a group of exposure units having varying pattern-element densities, or to maximize the patterned-beam current during transfer-exposure of a pattern having a certain pattern-element density and a certain blur tolerance.

Further, the microlithography method described above and shown in FIG. 6 may be adapted to perform CPB microlithography according to the various features of this embodiment.

Seventh Representative Embodiment

Figure 9:
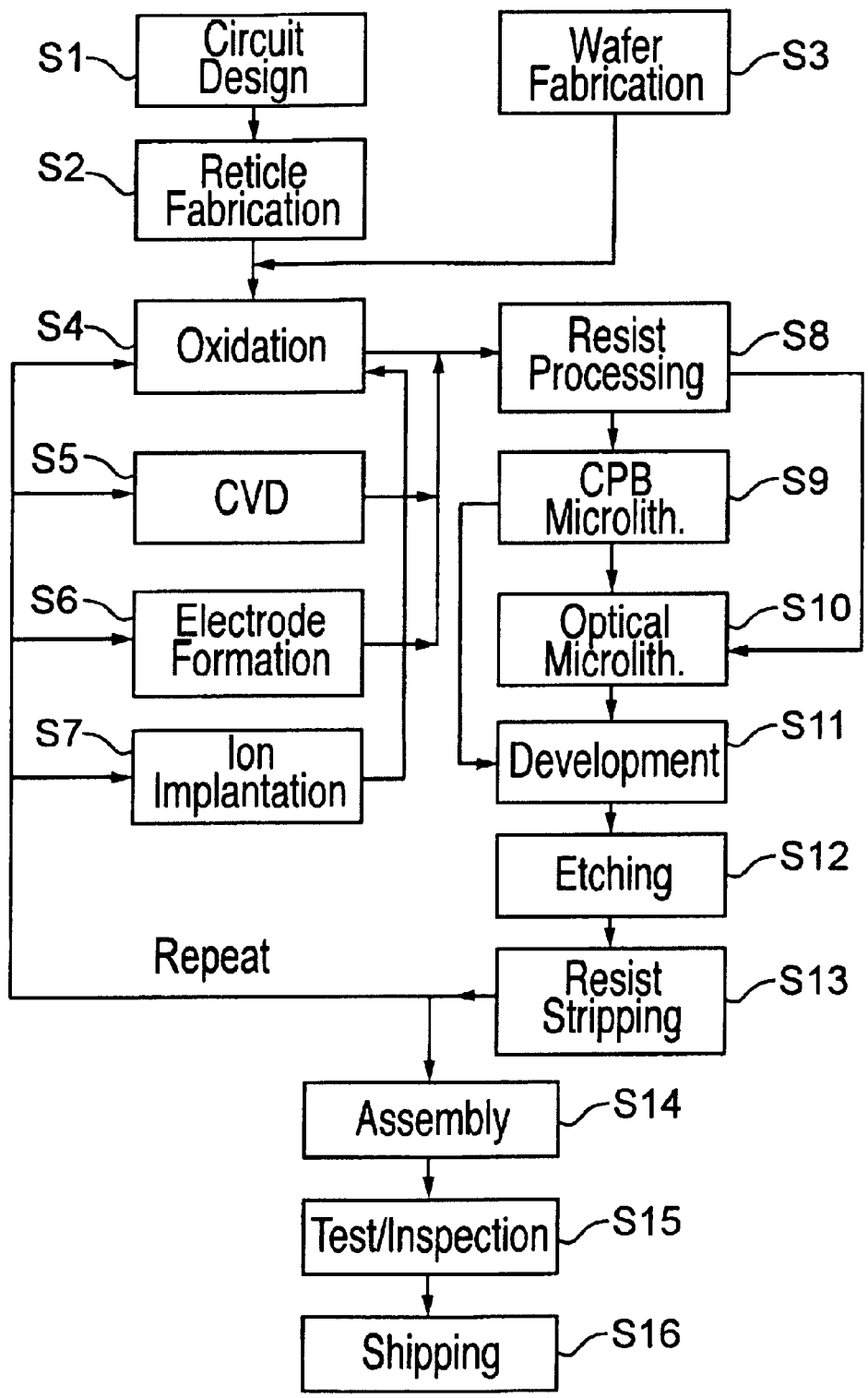
FIG. 9 is a flowchart of steps in a process for manufacturing a microelectronic device, the process including performing microlithography using a microlithography apparatus according to the invention.

FIG. 9 is a flow chart of steps in a process for manufacturing a microelectronic device utilizing any of the embodiments discussed. In step S1, the circuit for the device is designed. In step S2, a reticle ("mask") for the circuit is manufactured. In step S2, local resizing of pattern elements can be performed to correct for proximity effects or space-charge effects during exposure. In step S3, a wafer is manufactured from a material such as silicon.

Steps S4–S13 are directed to wafer-processing steps, in which the circuit pattern defined on the reticle is transferred onto the wafer by microlithography. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a CPB to imprint the resist with the reticle pattern of the reticle produced in step S2. In step S9, the CPB microlithography methods as described above are used. Step S10 involves microlithographically exposing the resist using optical microlithography. This step can also be performed using a reticle produced in step S2. Step S11 involves developing the exposed resist on the wafer. Step S12 involves etching the wafer to remove material from areas where developed resist is absent. Step S13 involves resist separation, in which remaining resist on the wafer is removed after the etching step. By repeating steps S4–S13 as required, circuit patterns as defined by successive reticles are formed superposedly on the wafer.

Step S14 is an assembly step (also termed a "postprocess" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the devices produced in step S14 are conducted. Afterward, devices that successfully pass step S15 are finished, packaged, and shipped (step S16).

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method in which a reticle, defining a pattern to be transferred onto a sensitive substrate, is irradiated with a charged-particle illumination beam, and a charged-particle patterned beam, formed by passage of the illumination beam through an exposure unit of the reticle and carrying an aerial image of the exposure unit of the reticle, is projected onto a sensitive surface of a substrate to imprint the sensitive surface with the aerial image, a method for optimizing image formation during transfer-exposure, the method comprising:

for each exposure unit to be transferred, determining a respective relationship between a semi-angle of the patterned beam incident on the substrate and total blur of the patterned beam resulting from space-charge effect and from geometrical aberration; and adjusting the beam semi-angle according to the relationship.

2. The method of claim 1, wherein the step of determining a relationship between the beam semi-angle and total blur comprises:

obtaining data relating to pattern-element density of the pattern being transferred;

obtaining data relating to a set of CPB-optical system parameters to be used during transfer-exposure;

calculating the blur resulting from geometrical aberration using the obtained data relating to the pattern-element density and the CPB-optical system parameters;

calculating the blur resulting from the space-charge effect using the obtained data relating to the pattern-element density and the CPB-optical system parameters;

calculating the total blur resulting from the combination of the blur from geometrical aberration and the blur from the space-charge effect; and calculating the relationship between the beam semi-angle and the total blur.

3. The method of claim 2, wherein the pattern-element density of the pattern being transferred comprises an average pattern-element density of a group of pattern elements being transferred.

4. The method of claim 1, wherein:

the step of determining the relationship between the beam semi-angle and total blur further comprises calculating an optimal beam semi-angle for which the blur is minimal; and the step of adjusting the beam semi-angle includes setting the beam semi-angle to the optimal value.

5. The method of claim 1, wherein:

the step of determining the relationship between the beam semi-angle and total blur further comprises calculating an optimal beam semi-angle for which the blur of the patterned beam is constant for a group of pattern elements being transferred; and the step of adjusting the beam semi-angle includes setting the beam semi-angle to the optimal value.

6. The method of claim 5, wherein the group of pattern elements is defined in a single exposure unit of the reticle.

7. The method of claim 5, wherein the group of pattern elements is defined in multiple exposure units of the reticle.

8. The method of claim 1, wherein:

the total blur during pattern transfer cannot exceed a maximum tolerance;

the step of determining the relationship between beam semi-angle and total blur further comprises calculating an optimal beam semi-angle for which the current of the patterned beam is maximized within the total blur tolerance; and the step of adjusting the beam semi-angle includes setting the beam semi-angle to the optimal value.

9. The method of claim 1, wherein the pattern to be transferred is defined by a plurality of exposure units configured as subfields arrayed on a segmented reticle, each subfield defining a respective portion of the pattern.

10. The method of claim 1, wherein the blur resulting from the space-charge effect is calculated using the formula, $$\text{blur} = \frac{I^{\frac{5}{6}} L^{\frac{5}{4}} M}{\alpha^{\frac{3}{5}} (SF)^{\frac{1}{2}} V^{\frac{3}{2}}}$$

where I is the beam current of the patterned beam; L is the distance between the substrate and the reticle; M is a demagnification ratio; a is the beam semi-angle; SF is the area of the exposure unit; and V is the acceleration voltage of the illumination beam.

11. A method for manufacturing a microelectronic device, comprising a microlithographic process as recited in claim 1.

12. In a charged-particle-beam (CPB) microlithography method in which a reticle, defining a pattern to be transferred onto a sensitive substrate, is irradiated with a charged-particle illumination beam, and a charged-particle patterned beam, formed by passage of the illumination beam through an exposure unit of the reticle and carrying an aerial image of the exposure unit of the reticle, is projected onto a sensitive surface of a substrate to imprint the sensitive surface with the aerial image, a method for optimizing image formation during transfer-exposure, the method comprising:

for each exposure unit to be transferred, determining a respective relationship between at least one beam characteristic and total blur of the patterned beam resulting from space-charge effects and from geometrical aberration, the at least one beam characteristic being selected from the group consisting of semi-angle of the patterned beam as incident on the substrate, current density of the illumination beam as incident on the reticle, and acceleration voltage of the illumination beam; and adjusting the beam semi-angle according to the relationship.

13. The method of claim 12, wherein the determining step comprises determining the relationship between any one of said beam characteristics and said total blur of the patterned beam.

14. The method of claim 13, wherein the determining step comprises determining the relationship between the semi-angle of the patterned beam as incident on the substrate and said total blur of the patterned beam.

15. The method of claim 13, wherein the determining step comprises determining the relationship between the current density of the illumination beam as incident on the reticle and said total blur of the patterned beam.

16. The method of claim 13, wherein the determining step comprises determining the relationship between the acceleration voltage of the illumination beam as incident on the reticle and said total blur of the patterned beam.

17. The method of claim 12, wherein the determining step comprises determining the relationship between any at least two of said beam characteristics and said total blur of the patterned beam.

18. The method of claim 12, wherein the determining step comprises determining the relationship between all three of said beam characteristics and said total blur of the patterned beam.

19. In a charged-particle-beam (CPB) microlithography method in which a stencil reticle, defining a pattern to be transferred onto a sensitive substrate, is irradiated with a charged-particle illumination beam, and a charged-particle patterned beam, formed by passage of the illumination beam through an exposure unit of the reticle and carrying an aerial image of the exposure unit of the reticle, is projected onto a sensitive surface of a substrate to imprint the sensitive surface with the aerial image, a method for optimizing image formation during transfer-exposure, the method comprising:

for each exposure unit to be transferred, determining a respective relationship between current density of the illumination beam incident to the reticle and total blur resulting from space-charge effect and from geometrical aberration; and adjusting the current density according to the relationship.

20. The method of claim 19, wherein the step of determining the relationship between current density and total blur comprises:

obtaining data relating to pattern-element density of the pattern being transferred;

obtaining data relating to a set of CPB-optical system parameters to be used during transfer-exposure;

calculating the blur resulting from geometrical aberration using the obtained data relating to the pattern-element density and the CPB-optical system parameters;

calculating the blur resulting from the space-charge effect using the obtained data relating to the pattern-element density and the CPB-optical system parameters;

calculating the total blur resulting from the combination of the blur from geometrical aberration and the blur from the space-charge effect; and calculating the relationship between the current density and the total blur.

21. The method of claim 20, wherein the pattern-element density of the pattern being transferred comprises an average pattern-element density of a group of pattern elements being transferred.

22. The method of claim 19, wherein:

the step of determining the relationship between current density and total blur further comprises calculating an optimal current density for which blur is minimal; and the step of adjusting the current density includes setting the current density to the optimal level.

23. The method of claim 19, wherein:

the step of determining the relationship between current density and total blur further comprises calculating an optimal current density for which blur is constant for a group of pattern elements being transferred; and the step of adjusting the current density includes setting the current density to the optimal level.

24. The method of claim 23, wherein the group of pattern elements is defined in a single exposure unit of the reticle.

25. The method of claim 23, wherein the group of pattern elements is defined in multiple exposure units of the reticle.

26. The method of claim 19, wherein:

the total blur during pattern transfer cannot exceed a maximum tolerance;

the step of determining the relationship between current density and total blur further comprises calculating an optimal current density for which the current of the patterned beam is maximized within the total blur tolerance; and the step of adjusting the current density includes setting the current density to the optimal level.

27. The method of claim 19, wherein the pattern to be transferred is defined by a plurality of exposure units configured as subfields arrayed on a segmented reticle, each subfield defining a respective portion of the pattern.

28. The method of claim 19, wherein the blur resulting from the space-charge effect is calculated using the formula, $$\text{blur} = \frac{I^{\frac{5}{6}} L^{\frac{5}{4}} M}{\alpha^{\frac{3}{5}} (SF)^{\frac{1}{2}} V^{\frac{3}{2}}}$$

where I is the beam current of the patterned beam; L is the distance between the substrate and the reticle; M is a demagnification ratio; a is the beam semi-angle; SF is the area of the exposure unit; and V is the acceleration voltage of the illumination beam.

29. A method for manufacturing a microelectronic device, comprising a microlithographic process as recited in claim 19.

30. In a charged-particle-beam (CPB) microlithography method in which a stencil reticle, defining a pattern to be transferred onto a sensitive substrate, is irradiated with a charged-particle illumination beam, and a charged-particle patterned beam, formed by passage of the illumination beam through an exposure unit of the reticle and carrying an aerial image of the exposure unit of the reticle, is projected onto a sensitive surface of a substrate to imprint the sensitive surface with the aerial image, a method for optimizing image formation during transfer-exposure, the method comprising:

for each exposure unit to be transferred, determining a respective relationship between acceleration voltage of the illumination beam and total blur resulting from the space-charge effect and geometrical aberration; and adjusting the acceleration voltage according to the relationship.

31. The method of claim 30, wherein the step of determining the relationship between acceleration voltage and total blur comprises:

obtaining data relating to pattern-element density of the pattern being transferred;

obtaining data relating to a set of CPB-optical system parameters to be used during transfer-exposure;

calculating the blur resulting from geometrical aberration using the obtained data relating to the pattern-element density and the CPB-optical system parameters;

calculating the blur resulting from the space-charge effect using the obtained data relating to the pattern-element density and the CPB-optical system parameters;

calculating the total blur resulting from the combination of the blur from geometrical aberration and the blur from the space-charge effect; and calculating the relationship between the acceleration voltage and the total blur.

32. The method of claim 31, wherein the pattern-element density of the pattern being transferred comprises an average pattern-element density of a group of pattern elements being transferred.

33. The method of claim 30, wherein:

the step of determining the relationship between acceleration voltage and total blur further comprises calculating an optimal acceleration voltage for which the blur is minimal; and the step of adjusting the acceleration voltage includes setting the acceleration voltage to the optimal level.

34. The method of claim 30, wherein:

the step of determining the relationship between acceleration voltage and total blur further comprises calculating an optimal acceleration voltage for which the blur is constant for a group of pattern elements being transferred; and the step of adjusting the acceleration voltage includes setting the acceleration voltage to the optimal level.

35. The method of claim 34, wherein the group of pattern elements is defined in a single exposure unit of the reticle.

36. The method of claim 34, wherein the group of pattern elements is defined in multiple exposure units of the reticle.

37. The method of claim 30, wherein:

the total blur during pattern transfer cannot exceed a maximum tolerance;

the step of determining the relationship between acceleration voltage and total blur further comprises calculating an optimal acceleration voltage for which the current of the patterned beam is maximized within the total blur tolerance; and the step of adjusting the acceleration voltage includes setting the acceleration voltage to the optimal level.

38. The method of claim 30, wherein the pattern to be transferred is defined by a plurality of exposure units configured as subfields arrayed on a segmented reticle, each subfield defining a respective portion of the pattern.

39. The method of claim 30, wherein the blur resulting from the space-charge effect is calculated using the formula, $$\text{blur} = \frac{I^{\frac{5}{6}} L^{\frac{5}{4}} M}{\alpha^{\frac{3}{5}} (SF)^{\frac{1}{2}} V^{\frac{3}{2}}}$$

where I is the beam current of the patterned beam; L is the distance between the substrate and the reticle; M is a demagnification ratio; a is the beam semi-angle; SF is the area of the exposure unit; and V is the acceleration voltage of the illumination beam.

40. A method for manufacturing a microelectronic device, comprising a microlithographic process as recited in claim 30.

41. In a charged-particle-beam (CPB) microlithography method in which a stencil reticle, defining a pattern to be transferred onto a sensitive substrate, is irradiated with a charged-particle illumination beam, and a charged-particle patterned beam, formed by passage of the illumination beam through an exposure unit of the reticle and carrying an aerial image of the exposure unit of the reticle, is projected onto a sensitive surface of a substrate to imprint the sensitive surface with the aerial image, a method for optimizing image formation during transfer-exposure, the method comprising:

for each exposure unit to be transferred, determining a respective relationship among beam semi-angle, current density, acceleration voltage, and total blur; and adjusting at least one of the beam semi-angle, the current density, and acceleration voltage according to the relationship.

42. The method of claim 41, wherein the step of determining the relationship among beam semi-angle, current density, acceleration voltage, and total blur comprises:

obtaining data relating to pattern-element density of the pattern being transferred;

obtaining data relating to a set of CPB-optical system parameters to be used during transfer-exposure;

calculating the blur resulting from geometrical aberration using the obtained data relating to the pattern-element density and the CPB-optical system parameters;

calculating the blur resulting from the space-charge effect using the obtained data relating to the pattern-element density and the CPB-optical system parameters;

calculating the total blur resulting from the combination of the blur from geometrical aberration and the blur from the space-charge effect; and calculating the relationship among the beam semi-angle, the current density of the illumination beam, the acceleration voltage, and the total blur.

43. The method of claim 42, wherein the pattern-element density of the pattern being transferred comprises an average pattern-element density of a group of pattern elements being transferred.

44. The method of claim 41, wherein:

the step of determining the relationship among beam semi-angle, current density, acceleration voltage, and total blur further comprises calculating at least one of an optimal beam semi-angle, current density, and acceleration voltage for which the blur is minimal; and the step of adjusting the beam semi-angle, current density, and acceleration voltage includes setting at least one of the beam semi-angle, the current density, and the acceleration voltage to the optimal level.

45. The method of claim 41, wherein:

the step of determining the relationship among beam semi-angle, current density, acceleration voltage, and total blur further comprises calculating at least one of an optimal beam semi-angle, current density, and acceleration voltage for which the blur is constant for a group of pattern elements transferred; and the step of adjusting the beam semi-angle, current density, and acceleration voltage includes setting at least one of the beam semi-angle, the current density, and the acceleration voltage to the optimal level.

46. The method of claim 45, wherein the group of pattern elements is defined in a single exposure unit of the reticle.

47. The method of claim 45, wherein the group of pattern elements is defined in multiple exposure units of the reticle.

48. The method of claim 41, wherein:

the total blur during pattern transfer cannot exceed a maximum tolerance;

the step of determining the relationship among beam semi-angle, current density, acceleration voltage, and total blur further comprises calculating at least one of an optimal beam semi-angle, current density, and acceleration voltage for which the current of the patterned beam is maximized within the total blur tolerance; and the step of adjusting the beam semi-angle, current density, and acceleration voltage includes setting at least one of the beam semi-angle, the current density, and the acceleration voltage to the optimal level.

49. The method of claim 41, wherein the pattern to be transferred is defined by a plurality of exposure units configured as subfields arrayed on a segmented reticle, each subfield defining a respective portion of the pattern.

50. The method of claim 41, wherein the blur resulting from the space-charge effect is calculated using the formula, $$\text{blur} = \frac{I^{\frac{5}{6}} L^{\frac{5}{4}} M}{a^{\frac{3}{5}} (SF)^{\frac{1}{2}} V^{\frac{3}{2}}}$$

where I is the beam current of the patterned beam; L is the distance between the substrate and the reticle; M is a demagnification ratio; a is the beam semi-angle; SF is the area of the exposure unit; and V is the acceleration voltage of the illumination beam.

51. A method for manufacturing a microelectronic device, comprising a microlithographic process as recited in claim 41.

52. A charged-particle-beam microlithography apparatus for transferring onto a sensitive substrate a pattern defined on reticle segmented into multiple exposure units, the apparatus comprising:

an illumination-optical system situated and configured to direct a charged-particle illumination beam from a source to a selected exposure unit on the reticle;

a projection-optical system situated and configured to direct a charged-particle patterned beam, formed by passage of a portion of the illumination beam through the exposure unit, from the exposure unit onto the sensitive substrate, so as to form a transfer image of the exposure unit on a selected corresponding region of the substrate;

a blur-measuring system situated and configured to measure a blur of an image projected by the projection-optical system;

a beam-adjustment system connected to the blur-measuring system, the beam-adjustment system being configured to calculate adjustments to be made to the illumination beam; and a controller connected to the illumination-optical system, the projection-optical system, and the beam-adjustment system, the controller being configured to control a beam semi-angle of the patterned beam, a current density of the illumination beam, and an acceleration voltage of the illumination beam according to the adjustments calculated by the beam-adjustment system.

53. The apparatus of claim 52, wherein the beam-adjustment system comprises:

storage means configured to store one or more algorithms and parameters used for calculating a total blur caused by the space-charge effect and geometrical aberration;

computing means configured to use the one or more algorithms and parameters stored in the storage means and measurements obtained by the beam-measuring system to calculate adjustments to be made to the CPB microlithography apparatus; and instruction means configured to instruct the controller to make the adjustments calculated by the computing means.

54. The apparatus of claim 52, wherein the beam-adjustment system calculates an optimal beam semi-angle of the illumination beam for which the blur is minimal and adjusts the beam semi-angle to the optimal value.

55. The apparatus of claim 52, wherein the beam-adjustment system calculates an optimal beam semi-angle of the illumination beam for which the blur is constant for a group of exposure units transferred and instructs the controller to adjust the beam semi-angle to the optimal value.

56. The apparatus of claim 52, wherein:

the blur during image transfer cannot exceed a maximum tolerance; and the beam-adjustment system calculates an optimal beam semi-angle for which the current of the patterned beam is maximized within the blur tolerance and instructs the controller to adjust the beam semi-angle to the optimal value.

57. The apparatus of claim 52, wherein the beam-adjustment system calculates an optimal current density of the illumination beam for which the blur is minimal and instructs the controller to adjust the current density to the optimal level.

58. The apparatus of claim 52, wherein the beam-adjustment system calculates an optimal current density of the illumination beam for which the blur is constant for a group of exposure units transferred and instructs the controller to adjust the current density to the optimal level.

59. The apparatus of claim 52, wherein:

the blur during image transfer cannot exceed a maximum tolerance; and the beam-adjustment system calculates an optimal current density for which the current of the patterned beam is maximized within the blur tolerance and instructs the controller to adjust the current density to the optimal level.

60. The apparatus of claim 52, wherein the beam-adjustment system calculates an optimal acceleration voltage of the illumination beam for which the blur is minimal and instructs the controller to adjust the acceleration voltage to the optimal level.

61. The apparatus of claim 52, wherein the beam-adjustment system calculates an optimal acceleration voltage of the illumination beam which the blur is constant for a group of exposure units transferred and instructs the controller to adjust the acceleration voltage to the optimal level.

62. The apparatus of claim 52, wherein:

the blur during image transfer cannot exceed a maximum tolerance; and the beam-adjustment system calculates an optimal acceleration voltage for which the current of the patterned beam is maximized within the blur tolerance and instructs the controller to adjust the acceleration voltage to the optimal level.

63. In a charged-particle-beam (CPB) microlithography method in which a stencil reticle, defining a pattern to be transferred onto a sensitive substrate, is irradiated with a charged-particle illumination beam, and a charged-particle patterned beam, formed by passage of the illumination beam through an illuminated portion of the reticle and carrying an aerial image of the illuminated portion of the reticle, is projected onto a sensitive surface of a substrate to imprint the sensitive surface with the aerial image, a method for transferring patterns having large pattern-element regions or non-self-supporting pattern element regions, the method comprising:

dividing the pattern into at least two complementary exposure regions;

grouping the divided exposure regions into a first group containing exposure regions having smaller apertures, and a second group containing exposure regions having larger apertures;

arranging the first group of exposure regions in a first reticle stripe;

arranging the second group of exposure regions in a second reticle stripe;

transferring the first reticle stripe to the substrate using settings for the charged particle beam that result in higher resolution image formation; and transferring the second reticle stripe to the substrate using settings for the charged particle beam that result in lower resolution image formation.

64. The method of claim 63, wherein the step of transferring the first reticle stripe includes adjusting the beam semi-angle to an optimal angle at which blur is minimized.

65. The method of claim 63, wherein the step of transferring the first reticle stripe includes adjusting the current density of the illumination beam to an optimal level at which blur is minimized.

66. The method of claim 63, wherein the step of transferring the first reticle stripe includes adjusting the acceleration voltage to an optimal level at which blur is minimized.

67. In a charged-particle-beam (CPB) microlithography method in which a divided reticle, defining a pattern divided into subfields defining respective portions of the pattern, is irradiated subfield-by-subfield with a charged-particle illumination beam, and in which a charged-particle patterned beam, formed by passage of the illumination beam through a subfield of the reticle and carrying an aerial image of the illuminated subfield, is projected onto a sensitive surface of a substrate to imprint the sensitive surface with the aerial image of the subfield, a method for optimizing image formation during transfer-exposure, the method comprising:

for at least one subfield to be transferred, determining a respective relationship between at least one beam characteristic and total blur of the respective patterned beam resulting from space-charge effects and from geometrical aberration, the at least one beam characteristic being selected from the group consisting of semi-angle of the respective patterned beam as incident on the substrate, current density of the illumination beam as incident on the respective subfield on the reticle, and acceleration voltage of the illumination beam;

adjusting the beam characteristic, according to the respective relationship, to reduce the total blur of the image of the respective subfield to within a predetermined blur tolerance; and exposing the substrate with an image of the respective subfield using the respective patterned beam having the adjusted beam characteristic.

* * * * *

UNITED STATES PATENT AND TRADEMARK OFFICE
CERTIFICATE OF CORRECTION

PATENT NO. : 6,917,048 B2
DATED : July 12, 2005
INVENTOR(S) : Fujiwara et al.

It is certified that error appears in the above-identified patent and that said Letters Patent is hereby corrected as shown below:

Column 7,
Line 18, "semi-angle a" should read -- semi-angle $\alpha$ --.

Column 12,
Line 51, "semi-angle a(mrad)" should read -- semi-angle $\alpha$ (mrad) -- .

Column 13,
Line 36, "units, contain" should read -- units contain --.

Column 16,
Line 50, "ratio; a is" should read -- ratio; $\alpha$ is --.

Column 18,
Line 48, "ratio; a is" should read -- ratio; $\alpha$ is --.

Column 20,
Line 9, "ratio; a is" should read -- ratio; $\alpha$ is --.

Column 21,
Line 40, "ratio; a is" should read -- ratio; $\alpha$ is --.

Signed and Sealed this

Twenty-second Day of November, 2005

JON W. DUDAS
*Director of the United States Patent and Trademark Office*